United States Patent
Hsieh

(10) Patent No.: US 7,596,232 B2
(45) Date of Patent: Sep. 29, 2009

(54) APPARATUS AND METHOD FOR ADJUSTING SOUND VOLUME FOR TELEVISIONS AND OTHER AUDIO SYSTEMS

(75) Inventor: Kuan-Hong Hsieh, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1080 days.

(21) Appl. No.: 10/955,310

(22) Filed: Sep. 30, 2004

(65) Prior Publication Data

US 2005/0238184 A1    Oct. 27, 2005

(30) Foreign Application Priority Data

Apr. 3, 2004    (CN) .................. 2004 1 0026798

(51) Int. Cl.
*H03G 3/00*    (2006.01)
*H03G 7/00*    (2006.01)
(52) U.S. Cl. ...................... 381/107; 381/106
(58) Field of Classification Search ......... 381/106–108, 381/102, 56, 58, 59; 348/738
See application file for complete search history.

(56) References Cited

U.S. PATENT DOCUMENTS

| 5,130,665 A | 7/1992 | Walden |
| 6,552,753 B1 | 4/2003 | Zhurbinskiy et al. |
| 2004/0184621 A1* | 9/2004 | Andersen et al. ............ 381/106 |
| 2005/0041819 A1* | 2/2005 | Brown ........................ 381/86 |

* cited by examiner

*Primary Examiner*—Ping Lee
(74) *Attorney, Agent, or Firm*—Frank R. Niranjan

(57) ABSTRACT

An apparatus (10) for adjusting sound volume for an audio system includes a controller (101) connected to an amplifier (40) of the audio system for controlling amplification of the amplifier, and a first circuit (102) for adjusting the sound volume. The controller includes a microprogrammed control unit (1010), a random-access memory (1012), and an electrically erasable programmable read-only memory (1014). The first circuit includes an attenuation circuit (1022) connected to a tuner (20) of the audio system for attenuating input audio signals, and a switch (1024). An input end of the switch is connected to the tuner, an output end of the attenuation circuit and the microprogrammed control unit; and an output end of the switch is connected to an audio processor (30). The apparatus enables a user to freely adjust an average level of sound produced by the audio system, and simultaneously avoid being bothered by loud transmissions.

8 Claims, 4 Drawing Sheets

APPARATUS AND METHOD FOR ADJUSTING SOUND VOLUME FOR TELEVISIONS AND OTHER AUDIO SYSTEMS

CROSS-REFERENCE TO RELATED APPLICATIONS

This application is related to a copending U.S. patent application entitled "APPARATUS AND METHOD FOR ADJUSTING SOUND VOLUME FOR TELEVISIONS AND OTHER AUDIO SYSTEMS", filed on the same day with the same applicant and assignee as the invention. The disclosure of the above identified application is incorporated herein by reference.

BACKGROUND OF THE INVENTION

1. Field of the Invention

The present invention relates to apparatuses and methods for adjusting sound volume for televisions and other audio systems.

2. Description of Prior Art

At times, a television or radio may broadcast an unexpected, noisy transmission to a user due to a programming change or when there are problems with reception. For example, a television or radio program provider may intentionally broadcast an advertisement at an abruptly high volume so as to attract the user's attention. On other occasions, signals received by the television or radio may be interfered with by signals transmitted by other electronic devices, thereby generating static or other unwanted transmissions. Loud advertisements or unexpected noises are perhaps least likely to bother the user during the daytime or in an environment that is otherwise relatively noisy. However, the user is likely to be easily bothered late at night or in a relatively quiet environment.

In order to overcome the above-mentioned problem, U.S. Pat. No. 5,130,665, issued on Jul. 14, 1992, discloses an audio volume controller. When the audio volume controller is in a control mode, the audio volume controller outputs audio signals whose volumes are between a predefined minimum volume and a predefined maximum volume. Therefore, the audio volume controller cannot output any audio signal whose volume is higher than the predefined maximum volume. This enables the user to avoid being bothered by loud noises. However, the user cannot freely adjust the average level of the sound produced by the audio volume controller in the control mode unless he/she switches the audio volume controller to exit the control mode. Thus, it is not convenient for the user to use the audio volume controller.

SUMMARY OF THE INVENTION

Accordingly, a primary object of the present invention is to provide an apparatus for facilitating a user to not only freely adjust an average level of sound produced by an audio system according to his/her particular requirements, but also simultaneously avoid being bothered by loud transmissions.

A second object of the present invention is to provide a method for facilitating a user to not only freely adjust an average level of sound produced by an audio system according to his/her particular requirements, but also simultaneously avoid being bothered by loud transmissions.

In order to fulfill the above-mentioned primary object, the present invention provides an apparatus for adjusting sound volume for an audio system. The apparatus comprises a controller connected to an amplifier of the audio system for controlling amplification of the amplifier, and a first circuit for adjusting the sound volume. The controller comprises a microprogrammed control unit (MCU), a Random-Access Memory (RAM) connected to the MCU, and a nonvolatile memory connected to the MCU. The first circuit comprises an attenuation circuit for attenuating input audio signals, and a switch. An input end of the switch is connected to a tuner of the audio system, an output end of the attenuation circuit and the MCU, and an output end of the switch is connected to an audio processor of the audio system.

The attenuation circuit comprises: a first resistor, a first end of the first resistor being connected to the tuner of the audio system; a second resistor, a first end of the second resistor being connected to a second end of the first resistor; a first diode, the anode of the first diode being connected to the second end of the first resistor; a second diode, the cathode of the second diode being connected to the cathode of the first diode; a third diode, the cathode of the third diode and the anode of the second diode being connected to a second end of the second resistor in parallel; a fourth diode, the anode of the fourth diode being connected to the anode of the third diode, the cathode of the fourth diode being connected to the second end of the first resistor; a third resistor, a first end of the third resistor being connected to the cathode of the first diode; a fourth resistor, a first end of the fourth resistor being connected to a second end of the third resistor, and a second end of the fourth resistor being connected to the anode of the fourth diode; a transistor, the base of the transistor being connected to the second end of the third resistor, the emitter of the transistor being connected to the first end of the third resistor, and the collector of the transistor being connected to the second end of the fourth resistor; and an integrated operational amplifier, the inverting input end of the integrated operational amplifier being connected to the second end of the first resistor, the non-inverting input end of the integrated operational amplifier being grounded, and the output end of the integrated operational amplifier being connected to the second end of the second resistor.

In order to fulfill the above-mentioned second object, the present invention provides a method for adjusting sound volume for an audio system. The method comprises the following steps: (a) determining whether an apparatus for adjusting sound volume is in an attenuation mode; (b) controlling a switch to switch a circuit for adjusting sound volume to an attenuation mode, if the apparatus for adjusting sound volume is in the attenuation mode; (c) attenuating an input audio signal, the input audio signal being attenuated slightly if it is relatively "weak," and the input audio signal being attenuated significantly if it is relatively "strong;" and (d) repeating steps (a) through (c) until the audio system is turned off.

Other objects, advantages and novel features of the present invention will become more apparent from the following

DETAILED DESCRIPTION OF THE INVENTION

Figure 1:
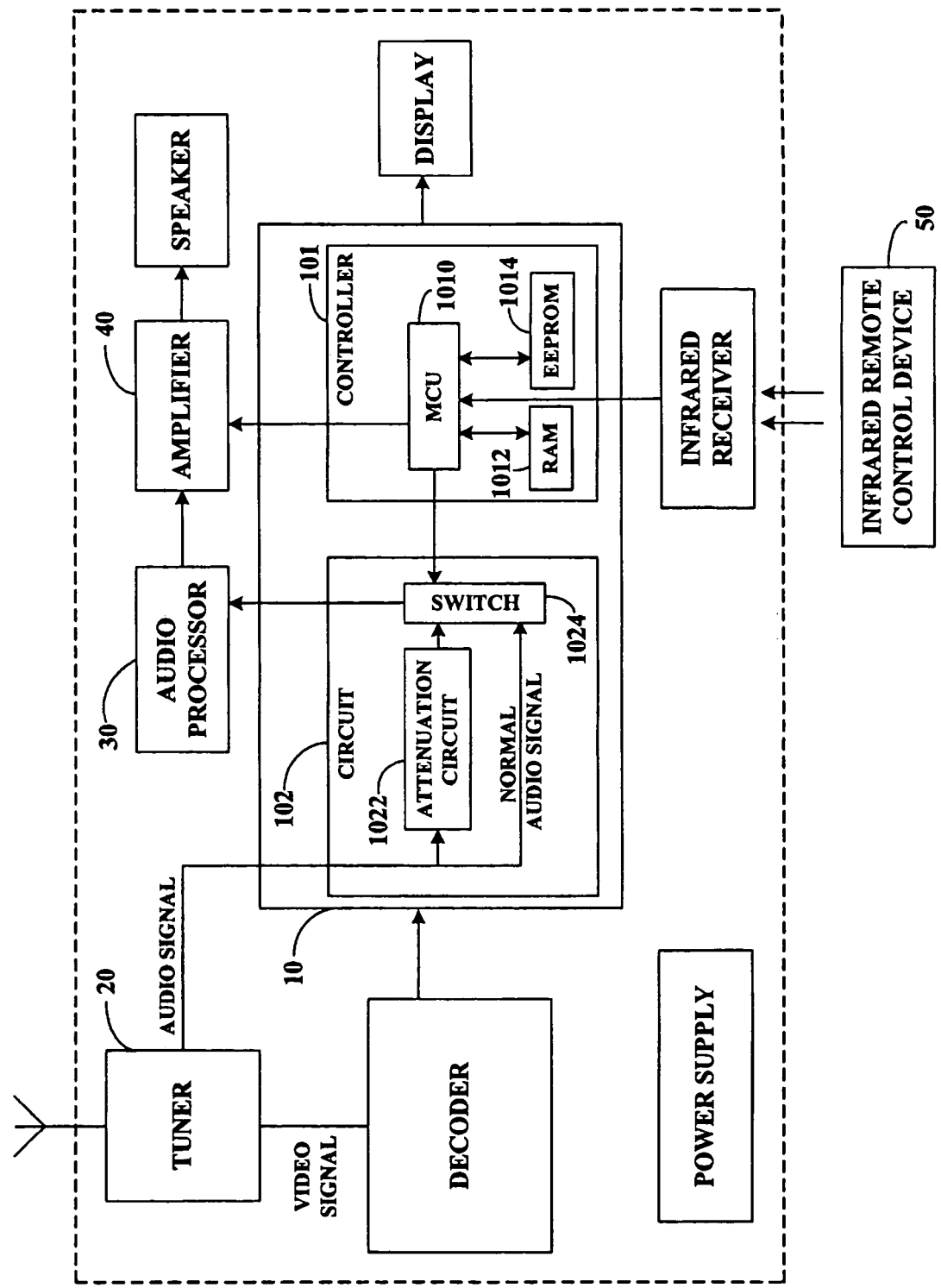
FIG. 1 is a simplified block diagram of part of a television having an apparatus for adjusting sound volume according to the present invention.

FIG. 1 is a simplified block diagram of part of a television having an apparatus 10 for adjusting sound volume according to the present invention. The apparatus 10 can run in either of two operating modes: a normal mode and an attenuation mode. A viewer switches the apparatus 10 to either of the above-mentioned operating modes by use of an infrared remote control device 50 or a functional key (not shown) on the television itself. The apparatus 10 comprises a controller 101, and a circuit 102 for adjusting the sound volume. The controller 101 comprises a microprogrammed control unit (MCU) 1010, a Random-Access Memory (RAM) 1012, and an Electrically Erasable Programmable Read-Only Memory (EEPROM) 1014. The RAM 1012 and the EEPROM 1014 are both connected to the MCU 1010. The controller 101 controls amplification of an amplifier 40 of the television. In other exemplary embodiments, the EEPROM 1014 may be replaced by any other suitable nonvolatile memory, such as a Read-Only Memory (ROM), an Erasable and Programmable Read-only Memory (EPROM), a flash memory, or the like.

The operating mode of the circuit 102 corresponds to the operating mode of the apparatus 10. That is, when the apparatus 10 is in the normal mode, the circuit 102 is also in a normal mode; similarly, when the apparatus 10 is in the attenuation mode, the circuit 102 is also in an attenuation mode. The circuit 102 comprises an attenuation circuit 1022, and a switch 1024 for switching the operating mode of the circuit 102. The input ends of the attenuation circuit 1022 and the switch 1024 are connected to a tuner 20 of the television. An output end of the attenuation circuit 1022 is connected to the input end of the switch 1024. The MCU 1010 is connected to the switch 1024, for controlling the switch 1024 to switch the operating modes of the circuit 102 according to the operating mode of the apparatus 10. The switch 1024 is connected to an audio processor 30, for outputting thereto unadjusted audio signals or audio signals attenuated by the attenuation circuit 1022.

Figure 2:
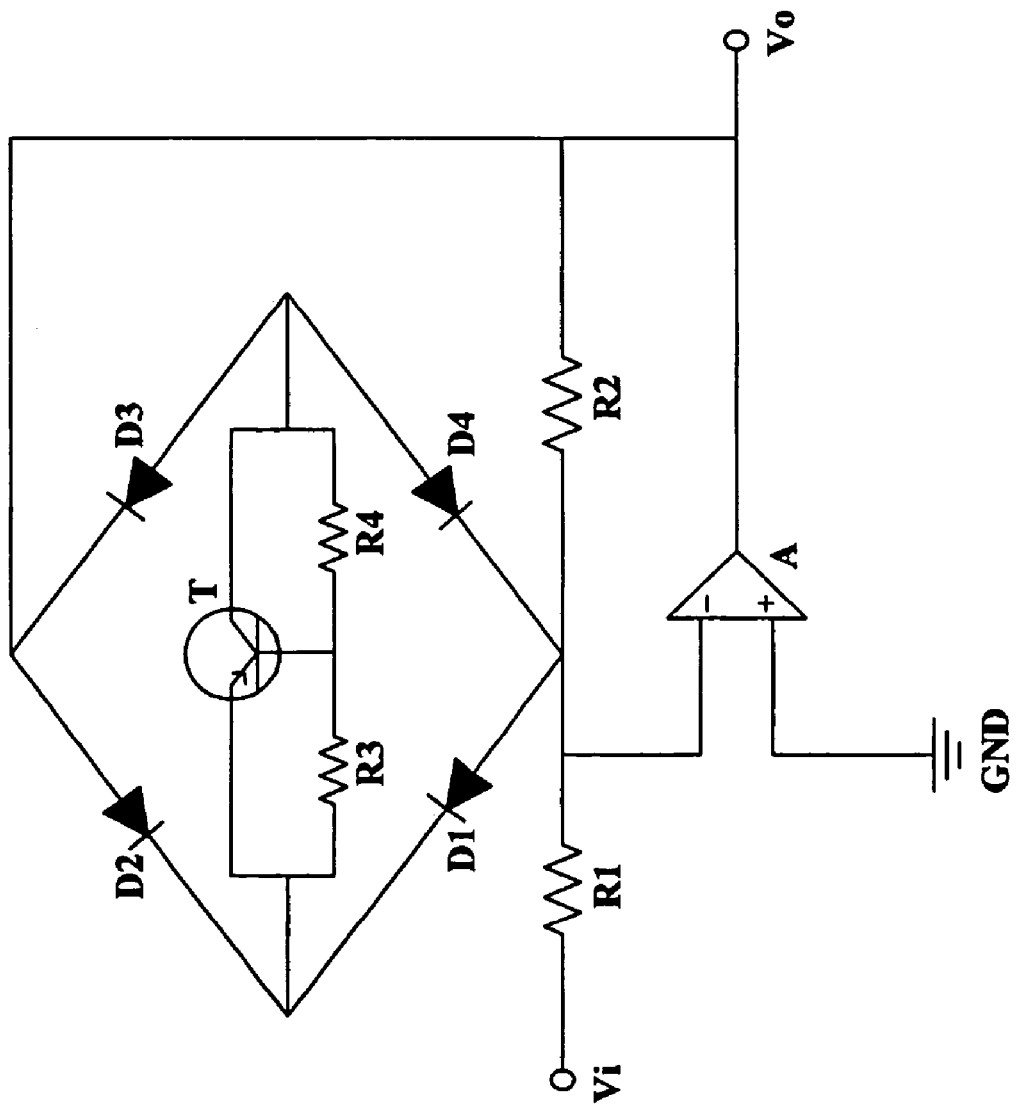
FIG. 2 is a circuit diagram of an attenuation circuit of FIG. 1.

FIG. 2 is a circuit diagram of the attenuation circuit 1022. In the present embodiment, the attenuation circuit 1022 comprises an integrated operational amplifier A, four resistors R1, R2, R3, R4, four diodes D1, D2, D3, D4, and a transistor T. A first end of the resistor R1 is connected to the tuner 20 of the television, and a second end of the resistor R1 is connected to a first end of the resistor R2. The resistors R3, R4, the diodes D1, D2, D3, D4, and the transistor T together form a bridge circuit. The anode of the diode D1 and the cathode of the diode D4 are commonly connected to the second end of the resistor R1. The cathode of the diode D1 is connected to the cathode of the diode D2, and the anode of the diode D4 is connected to the anode of the diode D3. The anode of the diode D2, the cathode of the diode D3 and the second end of the resistor R2 are commonly connected to an output end of the integrated operational amplifier A. A first end of the resistor R3 is connected to the cathode of the diode D1, and a second end of the resistor R3 is connected to a first end of the resistor R4. A second end of the resistor R4 is connected to the anode of the diode D4. The base of the transistor T is connected to the second end of the resistor R3. The emitter of the transistor T is connected to the first end of the resistor R3, and the collector of the transistor T is connected to the second end of the resistor R4. The inverting (−) input end of the integrated operational amplifier A is connected to the first end of the resistor R2. The non-inverting (+) input end of the integrated operational amplifier A is grounded, and the output end of the integrated operational amplifier A is connected to the input end of the switch 1024.

According to the above-described connections of the components of the attenuation circuit 1022, the audio signal output by the integrated operational amplifier A is fed back to the inverting input end thereof by way of the resistor R2 and the bridge circuit that is formed by the resistors R3, R4, the diodes D1, D2, D3, D4 and the transistor T. That is, the resistor R2 and the bridge circuit serve as a negative feedback circuit of the integrated operational amplifier A.

Figure 3:
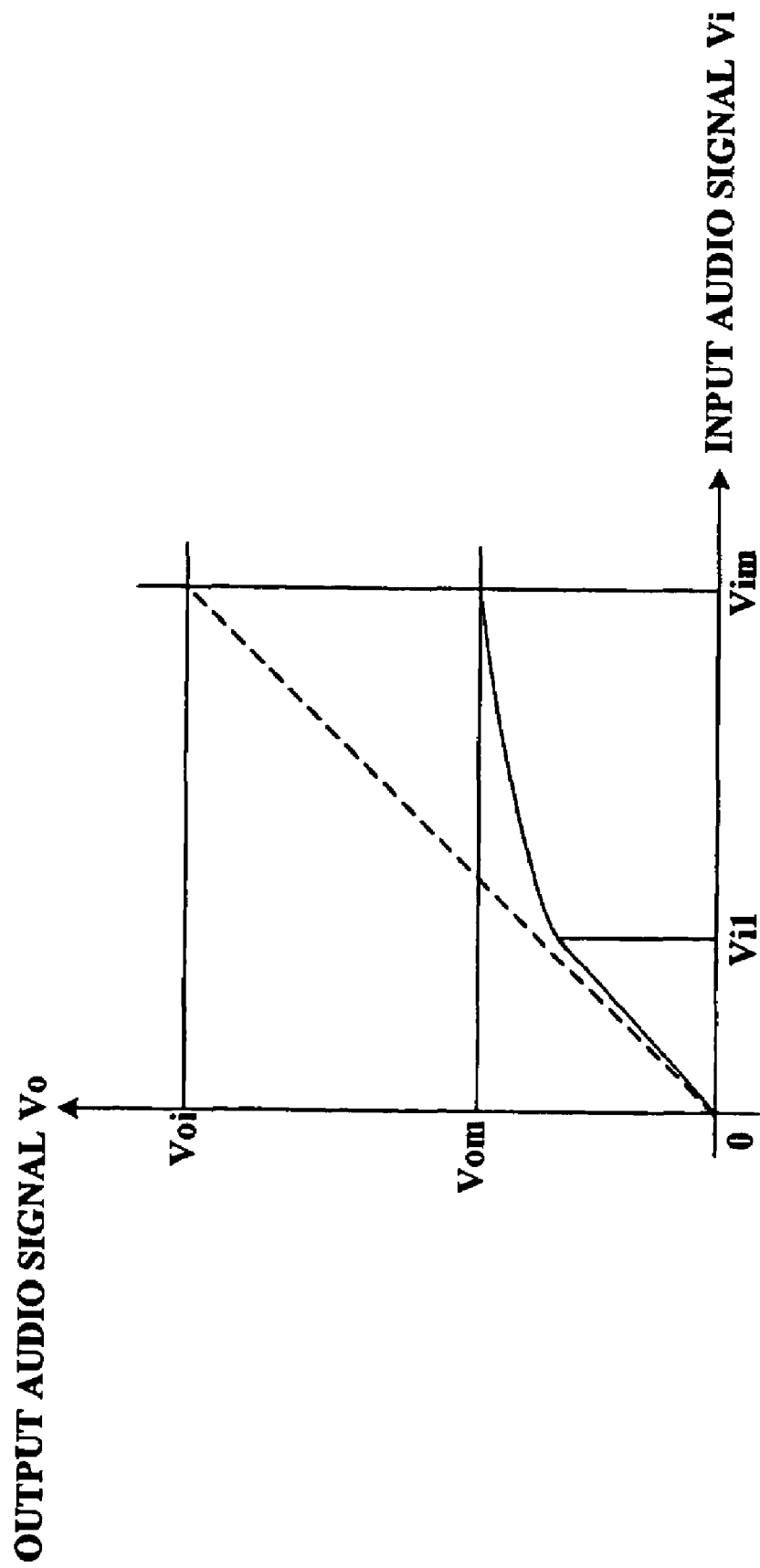
FIG. 3 is a graph of operation performance of the apparatus of FIG. 1.

FIG. 3 is a graph of operation performance of the apparatus 10. The horizontal abscissa represents an audio signal Vi input to the apparatus 10, and the vertical ordinate represents an audio signal Vo output from the apparatus 10. A value Vim of the horizontal abscissa is a maximum possible audio signal input to the apparatus 10. Values Voi and Vom of the vertical ordinate correspond to the value Vim, and respectively represent a maximum possible unadjusted audio signal and a maximum possible attenuated audio signal output by the apparatus 10. The input audio signal Vi may correspond to a television program, an advertisement, or an unexpected noise such as interference. When the viewer selects the normal mode of the apparatus 10 through the infrared remote control device 50 or the functional key on the television itself, the MCU 1010 controls the switch 1024 to switch the circuit 102 to the normal mode. In such case, the audio signal transmitted by the tuner 20 of the television is input to the switch 1024, and then is transmitted to the audio processor 30 of the television. The broken line of FIG. 3 shows a relationship between the input audio signal Vi and the output audio signal Vo of the apparatus 10 in the normal mode. In short, the audio signal Vo output by the apparatus 10 in the normal mode is same as the audio signal Vi input to the apparatus 10.

When the viewer selects the attenuation mode of the apparatus 10 through the infrared remote control device 50 or the functional key on the television itself, the MCU 1010 controls the switch 1024 to switch the circuit 102 to the attenuation mode. In such case, the audio signal transmitted by the tuner 20 of the television is input to the attenuation circuit 1022. The audio signal is input to the inverting input end of the integrated operational amplifier A via the resistor R1, and then is amplified and output by the integrated operational amplifier A. The audio signal amplified and output by the integrated operational amplifier A is fed back to the inverting input end thereof by way of the above-described negative feedback circuit. Because of the characteristics of the negative feedback circuit, when the audio signal input to the integrated operational amplifier A is relatively "weak," such as an audio signal lower than a value Vi1, the audio signal fed back by the negative feedback circuit is relatively "weak" and has few effect on the audio signal input to the integrated operational amplifier A. As a result, according to connections of the components of the attenuation circuit 1022, there is a linear attenuation relationship between the output audio signal and the input audio signal of the attenuation circuit 1022.

When the audio signal input to the attenuation circuit 1022 is relatively "strong," such as an audio signal higher than the value Vi1, the audio signal fed back by the negative feedback circuit is relatively "strong" and has a great effect on the audio signal input to the integrated operational amplifier A. In such case, the audio signal input to the integrated operational amplifier A is attenuated significantly. As a result, according to the connections of the components of the attenuation circuit 1022, there is a nonlinear attenuation relationship between the output audio signal and the input audio signal.

The solid line of FIG. 3 shows the linear and nonlinear attenuation relationships between the output audio signal Vo and the input audio signal Vi of the apparatus 10 in the attenuation mode. In short, when the audio signal Vi input to the apparatus 10 is relatively "weak," the attenuation circuit 1022 attenuates the audio signal Vi slightly; and when the audio signal Vi input to the apparatus 10 is relatively "strong," the attenuation circuit 1022 attenuates the audio signal Vi significantly. The output attenuated audio signal travels through the switch 1024 and the audio processor 30 of the television, and then is broadcast by a speaker of the television after being amplified by the amplifier 40. In this way, the viewer avoids being bothered by loud advertisements or unexpected noises.

The resistance values of the resistors R1, R2, R3, R4 are predefined by a manufacturer of the television. When the apparatus 10 is in the attenuation mode, the viewer can simultaneously adjust the sound volume via the infrared remote control device 50 or a functional key on the television itself according to his/her particular requirements. In order to realize the above-described function of adjusting the sound volume, the MCU 1010 controls the degree to which the amplifier 40 amplifies the audio signal. The apparatus 10 of the present invention is also applicable to other audio systems besides televisions, such as radios, CD disc players and personal stereos.

Figure 4:
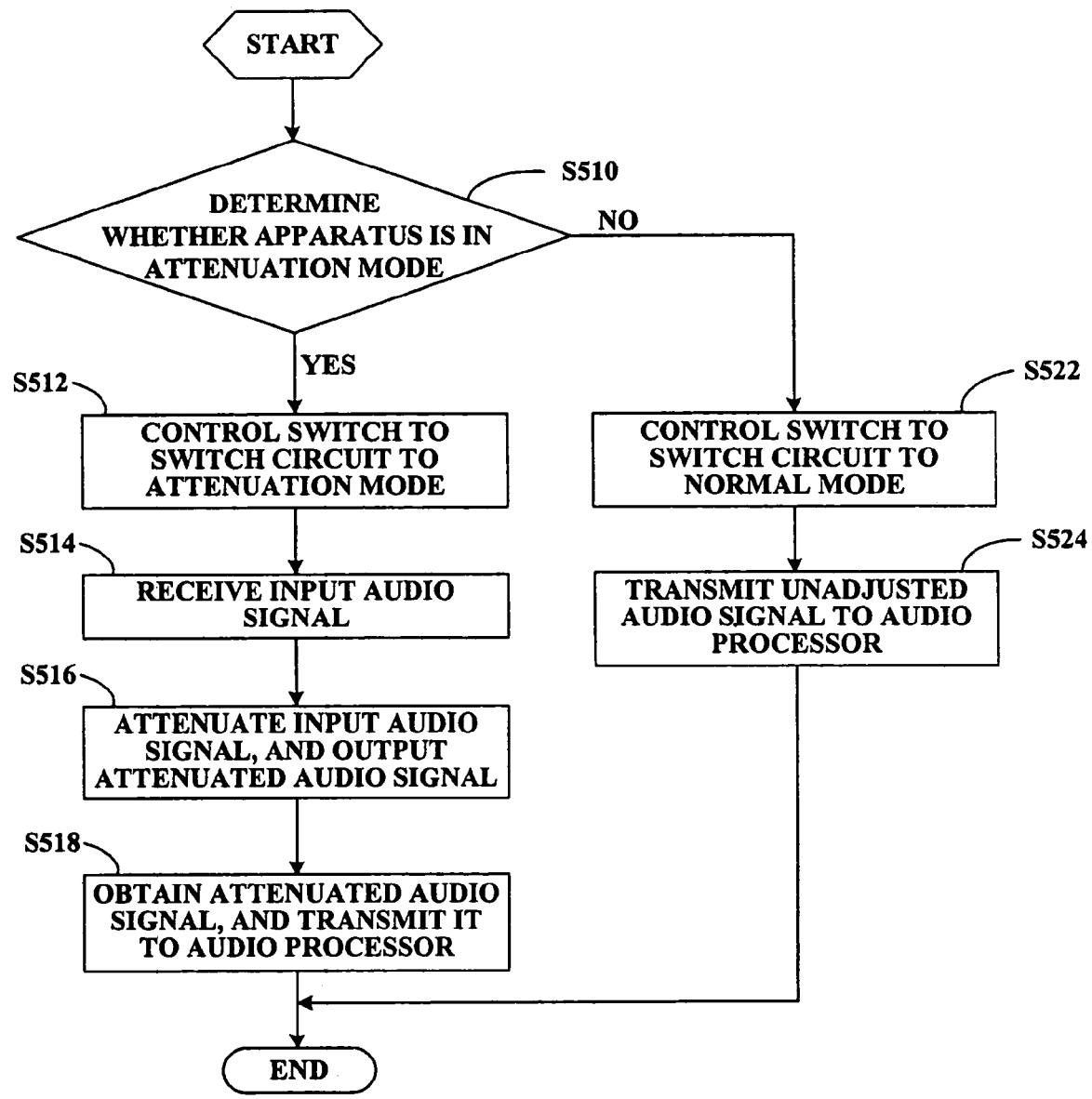
FIG. 4 is a flow chart of an exemplary method for adjusting sound volume according to the present invention.

FIG. 4 is a flow chart of an exemplary method for adjusting sound volume according to the present invention. A viewer selects an operating mode of the apparatus 10 via the infrared remote control device 50 or a functional key on the television itself. At step S510, the MCU 1010 determines whether the apparatus 10 is in the attenuation mode. If so, the procedure goes to step S512 described below. Otherwise, the procedure goes to step S522. At step S522, the MCU 1010 controls the switch 1024 to switch the circuit 102 to the normal mode. At step S524, the switch 1024 transmits an unadjusted audio signal to the audio processor 30, whereupon the procedure is ended. At step S512, the MCU 1010 controls the switch 1024 to switch the circuit 102 to the attenuation mode. At step S514, the attenuation circuit 1022 receives the input audio signal. At step S516, the attenuation circuit 1022 attenuates the input audio signal, and outputs an attenuated audio signal to the switch 1024. The attenuation circuit 1022 outputs a linearly-attenuated audio signal to the switch 1024 if the input audio signal is relatively "weak;" or the attenuation circuit 1022 outputs a nonlinearly-attenuated audio signal to the switch 1024 if the input audio signal is relatively "strong." At step S518, the switch 1024 obtains the attenuated audio signal from the attenuation circuit 1022, and then transmits it to the audio processor 30, whereupon the procedure is ended.

The above-described procedure is repeated continually from the time the viewer turns on the television until the time the viewer turns off the television.

While a preferred embodiment and preferred method of the present invention have been described above, it should be understood that they have been presented by way of example only and not by way of limitation. Thus the breadth and scope of the present invention should not be limited by the above-described exemplary embodiment and method, but should be defined only in accordance with the following claims and their equivalents.

What is claimed is:

1. An apparatus for adjusting sound volume for an audio system, the apparatus comprising:

a controller connected to an amplifier of the audio system for controlling amplification of the amplifier, the controller comprising:
a microprogrammed control unit (MCU) for controlling a switch to switch an operating mode of the apparatus, wherein the operating mode comprises an attenuation mode; and
a first circuit for adjusting the sound volume, the first circuit comprising:
an attenuation circuit for attenuating input audio signals, the attenuation circuit comprising;
a first resistor, a first end of the first resistor being connected to a tuner of the audio system;
a second resistor, a first end of the second resistor being connected to a second end of the first resistor;
a first diode, the anode of the first diode being connected to the second end of the first resistor;
a second diode, the cathode of the second diode being connected to the cathode of the first diode;
a third diode, the cathode of the third diode and the anode of the second diode being connected to a second end of the second resistor in parallel;
a fourth diode, the anode of the fourth diode being connected to the anode of the third diode, the cathode of the fourth diode being connected to the second end of the first resistor; a third resistor, a first end of the third resistor being connected to the cathode of the first diode;
a fourth resistor, a first end of the fourth resistor being connected to a second end of the third resistor, and a second end of the fourth resistor being connected to the anode of the fourth diode;
a transistor, the base of the transistor being connected to the second end of the third resistor, the emitter of the transistor being connected to the first end of the third resistor, and the collector of the transistor being connected to the second end of the fourth resistor; and
an integrated operational amplifier, the inverting input end of the integrated operational amplifier being connected to the second end of the first resistor, the non-inverting input end of the integrated operational amplifier being grounded, and the output end of the integrated operational amplifier being connected to the second end of the second resistor; and the switch, an input end of the switch being connected to the tuner of the audio system, the output end of the integrated operational amplifier and the MCU, and an output end of the switch being connected to an audio processor of the audio system;

wherein when the apparatus is in the attenuation mode, the MCU controls the switch to switch the first circuit to the attenuation mode and the attenuation circuit attenuates the input audio signal, the attenuation being a first slight attenuation if the input audio signal is relatively "weak" according to a predefined criterion, the attenuation being a second significant attenuation greater than the first slight attenuation if the input audio signal is relatively "strong" according to the predefined criterion.

2. The apparatus as claimed in claim 1, wherein the controller further comprises a Random-Access Memory (RAM) connected to the MCU, and a nonvolatile memory connected to the MCU.

3. The apparatus as claimed in claim 2, wherein the nonvolatile memory is a Read-Only Memory (ROM), an Erasable and Programmable Read-Only Memory (EPROM), an Electrically Erasable Programmable Read-Only Memory (EEPROM), or a flash memory.

4. The apparatus as claimed in claim 1, wherein the operating mode further comprises a normal mode.

5. The apparatus as claimed in claim 4, wherein when the apparatus is in the normal mode, the MCU controls the switch to switch the first circuit to the normal mode.

6. The apparatus as claimed in claim 5, wherein the audio signals are input to the switch and then transmitted to the audio processor of the audio system.

7. The apparatus as claimed in claim 6, wherein an output audio signal of the apparatus is the same as a corresponding input audio signal thereof.

8. The apparatus as claimed in claim 1, wherein the audio signals are input to the attenuation circuit, and then transmitted to the audio processor of the audio system via the switch.

* * * * *

UNITED STATES PATENT AND TRADEMARK OFFICE
CERTIFICATE OF CORRECTION

| | | |
|---|---|---|
| PATENT NO. | : 7,596,232 B2 | Page 1 of 1 |
| APPLICATION NO. | : 10/955310 | |
| DATED | : September 29, 2009 | |
| INVENTOR(S) | : Kuan-Hong Hsieh | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1399 days.

Signed and Sealed this

Twenty-eighth Day of September, 2010

David J. Kappos
*Director of the United States Patent and Trademark Office*